(12) United States Patent
Hafed et al.

(10) Patent No.: US 7,315,574 B2
(45) Date of Patent: Jan. 1, 2008

(54) SYSTEM AND METHOD FOR GENERATING A JITTERED TEST SIGNAL

(75) Inventors: Mohamed M. Hafed, Montreal (CA); Geoffrey D. Duerden, Montreal (CA); Gordon W. Roberts, Montreal (CA)

(73) Assignee: DFT Microsystems, Inc., Norristown, PA (US)

( * ) Notice: Subject to any disclaimer, the term of this patent is extended or adjusted under 35 U.S.C. 154(b) by 182 days.

(21) Appl. No.: 11/114,572

(22) Filed: Apr. 26, 2005

(65) Prior Publication Data

US 2005/0271131 A1 Dec. 8, 2005

Related U.S. Application Data

(60) Provisional application No. 60/568,102, filed on May 3, 2004.

(51) Int. Cl.
  *H04B 17/00* (2006.01)
  *H04Q 1/20* (2006.01)

(52) U.S. Cl. .............. 375/226; 375/225; 375/227; 375/228; 375/280

(58) Field of Classification Search ............ 375/224, 375/225, 226, 227, 371, 373, 375, 376; 324/765; 327/280, 287, 153, 157
See application file for complete search history.

(56) References Cited

U.S. PATENT DOCUMENTS

| | | | |
|---|---|---|---|
| 5,835,501 A | 11/1998 | Dalmia et al. ............ 371/5.1 |
| 5,903,605 A | 5/1999 | Crittenden | |
| 6,185,510 B1 | 2/2001 | Inoue | |
| 6,275,057 B1* | 8/2001 | Takizawa ............ 324/765 |
| 6,522,122 B2 | 2/2003 | Watanabe et al. | |
| 6,594,595 B2 | 7/2003 | Yamaguchi et al. | |
| 6,665,808 B1* | 12/2003 | Schinzel ............ 713/501 |
| 7,103,791 B2* | 9/2006 | Lin ............ 713/401 |
| 2004/0156429 A1* | 8/2004 | Joseph et al. ............ 375/224 |
| 2004/0252802 A1* | 12/2004 | Yamaguchi ............ 375/371 |
| 2005/0069031 A1* | 3/2005 | Sunter et al. ............ 375/224 |
| 2005/0111536 A1* | 5/2005 | Cranford et al. ............ 375/226 |
| 2005/0163204 A1* | 7/2005 | Brewer ............ 375/224 |
| 2005/0253617 A1* | 11/2005 | Roberts et al. ............ 324/765 |

FOREIGN PATENT DOCUMENTS

WO  WO03/073680 A2  9/2003

* cited by examiner

*Primary Examiner*—Chieh Fan
*Assistant Examiner*—Qutub Ghulamali
(74) *Attorney, Agent, or Firm*—Downs Rachlin Martin PLLC

(57) ABSTRACT

A multi-speed jittered signal generator (216, 400) that generates a full-speed jittered signal (404) by scaling a low-speed jittered signal (420) using a frequency scaler (428). The low-speed jittered signal is created by injecting a modulation signal (416) into a reference signal (412) using a jitter injector (432). Injecting jitter into a low-speed reference signal allows the full-speed jittered signal to be of higher quality than conventional jitter signals created by injecting jitter information into a full-speed reference signal. The multi-speed jittered signal generator may be used as part of a testing system (208) for testing various circuitry, such as high-speed serializer/deserializer circuitry (220).

17 Claims, 6 Drawing Sheets

X                          Y
A— (f1) = 600.0000 MHz     4.11 dBm
B— (f1) = 604.2364 MHz     4.11 dBm
Δ = 4.2364 MHz             0.0 dB
1/ΔX = 236.051 ns y scale 5.811 khits /    mean -959.0047 ps    median -961.0505 ps    hits 69.77 khits
y offset 0 hits          std dev 15.6771 ps   p-p 172.7 ps           peak 23.24 khits
                         μ ±1σ  83.8%         min -1.0429 ns
                         μ ±2σ  96.2%         max -870.1 ps
                         μ ±3σ  97.4% y scale 3.458 khits /    mean 7.717390674 μs    median 7.717393091 μs    hits 643.8 khits
y offset 0 hits          std dev 20.3534 ps     p-p 151.9 ps             peak 13.83 khits
                         μ ±1σ  72.4%           min 7.7172904 μs
                         μ ±2σ  96.4%           max 7.7174422 μs
                         μ ±3σ  98.8%

SYSTEM AND METHOD FOR GENERATING A JITTERED TEST SIGNAL

RELATED APPLICATION DATA

This application claims the benefit of priority of U.S. Provisional Patent Application Ser. No. 60/568,102, filed May 3, 2004 and entitled, "Method And Integrated Circuits For Injecting Arbitrary Timing Errors in High Speed Digital Signals," which is incorporated by reference herein in its entirety.

FIELD OF THE INVENTION

The present invention relates generally to the field of integrated circuits. More particularly, the present invention is directed to a system and method for generating a jittered test signal.

BACKGROUND OF THE INVENTION

Various types of circuitry are tested for jitter tolerance by exciting the circuitry with one or more jittered test signals and then measuring and analyzing the circuitry's response(s) to the jittered signal(s). One example of such jitter testing is the testing of serializer/deserializer (SerDes) devices to determine their bit error rate (BER), which is a key figure of merit for SerDes devices. A specific example of jitter testing is disclosed in U.S. patent application Ser. No. 10/838,846, entitled "System And Method For Testing Integrated Circuits," filed on May 3, 2004, in the names of Roberts et al., that is incorporated by reference herein in its entirety.

FIG. 1 shows an exemplary prior art jitter generator 100 for stimulating circuitry 104 of a device-under-test (DUT) 108 with a full-test-speed jittered test signal 112 in a conventional manner. Conventionally, a low-frequency reference signal 116 is scaled up to a desired test frequency by a frequency scaler 120 so as to create a full-speed reference signal 124. A modulation signal 128 is then injected into full-speed reference signal 124 by injection circuitry 132 so as to create full-speed jittered test signal 112. Modulation signal 128 is sometimes an analog waveform generated using an arbitrary waveform generator. In the context of testing high-speed digital integrated circuits and systems, sometimes arbitrary signals are not required and only random noise tolerance is verified. In such a scenario, jitter injection can be simplified further by directly superimposing modulation signal 128 (in this case noise) onto full-speed reference signal 124. While this simplifies the implementation, it still requires an analog input from an arbitrary waveform generator or alternative noise source.

U.S. Pat. No. 6,665,808 discloses a state-of-the-art test signal generator that utilizes a microprocessor for generating a nominal parameter value signal and a memory for storing and generating a parameter variation value signal. The nominal parameter value signal and parameter variation value signal are combined by a coupler that provides the combined signal to a full-speed reference signal.

These schemes generally work well for relatively low- and moderate-frequency test signals. However, as circuitry speeds increase, jitter injection circuits become more and more difficult to implement due to their increasing sensitivity to disturbances, such as noise, environmental effects and parasitic effects, that affect the quality of the full-speed test signal. This difficulty is typically manifested as increased cost of implementation due to factors such as the need to use exotic semiconductor processing techniques and/or materials and/or relatively complex circuitry to implement conventional high-speed test signal generators. What is needed are a low-cost system and method for generating high-quality full-speed jittered signals for jitter testing.

SUMMARY OF THE INVENTION

In one aspect, the present invention is directed to a system for generating a jittered signal. The system comprises a jitter injector operatively configured to inject jitter into a reference signal having a first frequency so as to generate a first jittered signal. A frequency scaler is operatively configured to multiply the first jittered signal by a frequency multiplier so as to generate a second jittered signal having a second frequency higher than the first frequency.

In another aspect, the present invention is directed to a system comprising functional circuitry and a testing system in electrical communication with the functional circuitry. The testing system is operatively configured to stimulate the functional circuitry as a function of a first jittered signal having a first frequency. The testing system comprises a jitter injector operatively configured to inject jitter into a reference signal having a first frequency so as to generate a second jittered signal having a second frequency less than the first frequency. A frequency scaler operatively configured to multiply the second jittered signal by a multiplier so as to generate the first jittered signal.

In yet another aspect, the present invention is directed to a method of generating a first jittered signal having a first frequency. The method comprises the step of injecting jitter into a reference signal so as to generate a first jittered signal having a first frequency. The first jittered signal is multiplied by a predetermined frequency multiplier so as to generate a second jittered signal having a second frequency greater than the first frequency.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 2:
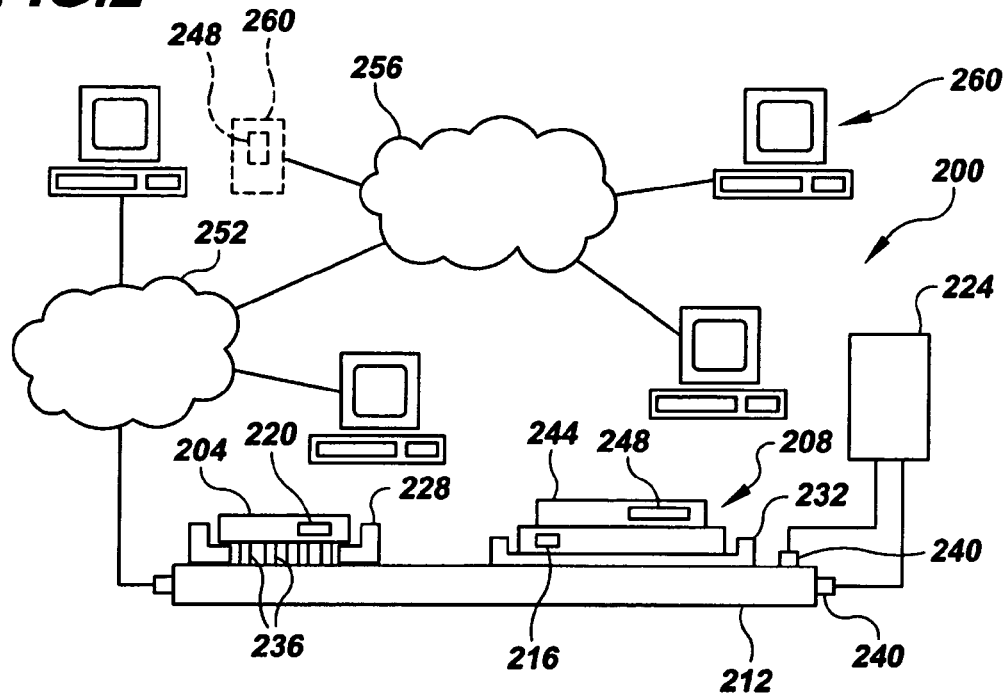
FIG. 2 is a partial high-level schematic diagram/partial side view of a testing setup that comprises a testing system that includes a multi-speed jittered signal generator of the present invention.

Referring to the drawings, FIG. 2 shows in accordance with the present invention a testing setup, which is generally denoted by the numeral 200. Testing setup 200 generally includes a device under test (DUT) 204 and a testing system 208 in electrical communication with the DUT via an interface, such as an interface board 212, that provides signal paths between the DUT and the testing system. Testing system 208 includes a multi-speed jittered signal generator 216 capable of generating a full-speed jittered test signal (not shown) having a quality superior to the quality of conventionally generated jittered test signals. As described below in detail in connection with FIG. 4, jittered signal generator 216 is referred to herein as being "multi-speed" to indicate that a reference jittered signal is generated at a first speed and then scaled-up in speed so as to create a full-speed jittered test signal that is provided to DUT 204. Generating a full-speed test signal in this manner allows multi-speed jittered signal generator 216 to provided a jittered test signal that is less affected by disturbances, such as noise and electrical and parasitic effects, than conventionally generated full-speed jittered test signals.

Figure 1:
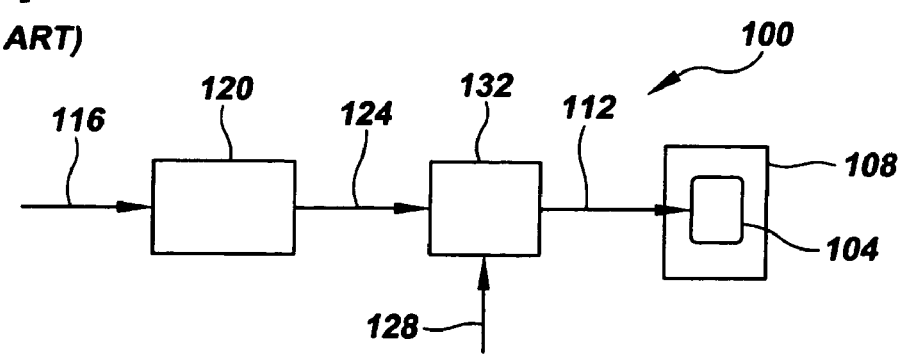
FIG. 1 is a circuit diagram of an exemplary prior art jitter signal generator that generates a full-speed jittered signal in a conventional manner.

DUT 204 may include high-speed circuitry, e.g., serializer/deserializer (SerDes) circuitry 220, to be tested using multi-speed jittered signal generator 216. Although SerDes circuitry 220 provides a purely digital function, i.e., transforming parallel digital data into a serial bit stream, and vice versa, it behaves in an analog-like manner, particularly in the low voltage differential signaling technology typically used at gigabit-per-second (Gbps) speeds. Jitter measurement has been found to be an important factor in SerDes testing for measuring a bit error rate (BER) of the SerDes circuitry. The BER is the most important figure of merit for SerDes circuitry. Again, it is emphasized that this example is presented to illustrate testing system 208 (FIG. 1) and, more particularly, multi-speed jittered signal generator 216 relative to a concrete and presently timely application. As those skilled in the art will readily appreciate, however, multi-speed jittered signal generator is by no means limited to jitter testing of SerDes circuitry 220. On the contrary, any one or more of the high-level features and concepts of the present invention may be implemented in virtually any sort of circuit testing application that includes jitter testing, such as the testing of phase-locked loop (PLL) circuits, clock distribution buffers and retimers, among other things.

As is well-known in the art, high-speed digital circuitry, such as SerDes circuitry 220, may be used to send and receive parallel data over one or more serial links in a wide variety of applications, such as data communication applications complying with any one or more of a large array of communication standards. These standards include chip-to-chip and board-to-board standards, such as PCI express, and long-distance telecommunication standards, such as SONET. Presently, SerDes circuitry is being designed to operate in a Gbps regime and will likely operate faster in the future. Conventional ATE, standing alone, are often unsuitable for testing Gbps SerDes devices due to their internal clocks being too slow to test these devices at their rated speeds.

Typically, though not necessarily, DUT 204 will be an integrated circuit chip or chip set. The corresponding circuit(s) to be tested, e.g., SerDes circuitry 220, may be any digital, analog or mixed-signal circuit(s) amenable to electrical performance and/or characterization testing. Those skilled in the art will understand that due to the wide variety of circuitry that may be tested using testing system 208 of the present invention, there is a corresponding wide variety of performance and characterization tests that may be implemented using testing system 208. Thus, while the present invention is particularly described in connection with the testing of SerDes circuitry 220, it is by no means limited to this one application. Rather, the SerDes implementation is provided to exemplify various features of the present invention. Those skilled in the art will readily understand how to apply these features and the broad principles of the present invention to other types of testable circuitry and tests.

Further, it is noted that although multi-speed jittered signal generator 216 is shown as being implemented in testing system 208, it may be implemented in virtually any testing setup, such as in an automated testing equipment (ATE) based setup, a standalone jitter testing setup or built-in self test (BIST) setup, among others. Indeed, a multi-speed jittered signal generator of the present invention is well suited to BIST implementations due to the hardware efficiency in generating the modulating signal, such as modulating signal 416 of FIG. 4, discussed below. An example of a BIST implementation is discussed below in conjunction with FIGS. 4 and 12. Those skilled in the art will readily understand the modifications necessary to implement multi-speed jittered signal generator 216 in any one of these alternative setups, such that a detailed explanation of each is not necessary for those skilled in the art to practice the invention to its fullest scope. For a more detailed description of additional features that may be included in testing setup 200, reference may be made to U.S. patent application Ser. No. 10/838,846, entitled "System And Method For Testing Integrated Circuits," filed on May 3, 2004, which is incorporated by reference herein in its entirety.

Interface board 212, e.g., may be a conventional device interface board (DIB) used in conjunction with ATE 224. Interface board 212 may include one or more DUT sockets 228 for receiving a corresponding number of DUTs (204), as well as one or more tester-support sockets 232 for receiving various testing modules or testing boards, one or more of which may include testing system 208. As used herein, the term "socket" and like terms are used in a broad sense to denote any structure(s) that are part of, and/or engage, interface board 212 so as to substantially fix testing system 208 relative to the board and electrically connect the testing system to the board. On conventional DIBs, tester-support sockets 232 are generally provided for receiving various modules and/or boards (not shown), such as signal conditioning boards, among others, that support testing via ATE 224. Each DUT socket 228 may include a plurality of electrical connectors/contacts 236, e.g., pogo pins, among others, for electrically connecting the corresponding DUT 204 to interface board 212. Similarly, each tester-support socket 232 may include electrical connectors (not shown), e.g., pin contacts, among others, for electrically connecting the corresponding test module, in this case testing system 208, to interface board 212.

Interface board 212 may also include other conventional electronics (not shown) for controlling the board, and communications ports 240 for electrically connecting ATE 224 to the board. In other embodiments of testing setup 200 of the present invention, the interface may be standalone device characterization board (not shown), e.g., a board similar to interface board 212, but not including the electronics and communications ports 132 needed for communicating with ATE 224. ATE 224, if present, may be a conventional ATE, e.g., a legacy ATE, or may be specially adapted for use with testing system 208 of the present invention.

Testing setup 200 may optionally include a host computer 244 containing a user interface 248, e.g., a graphical user interface, operatively configured for programming and/or controlling the operation of testing system 208. Host computer 244 may be integrated into testing system 208 or may alternatively be located remotely from the testing system, e.g., across one or more computer networks, such as a local area network (LAN) 252 and wide area network (WAN) 256, including the Internet. Implementation of user interface 248 could allow a user to operate testing system 208 from virtually any suitable user device 260 from virtually any location.

Figure 3:
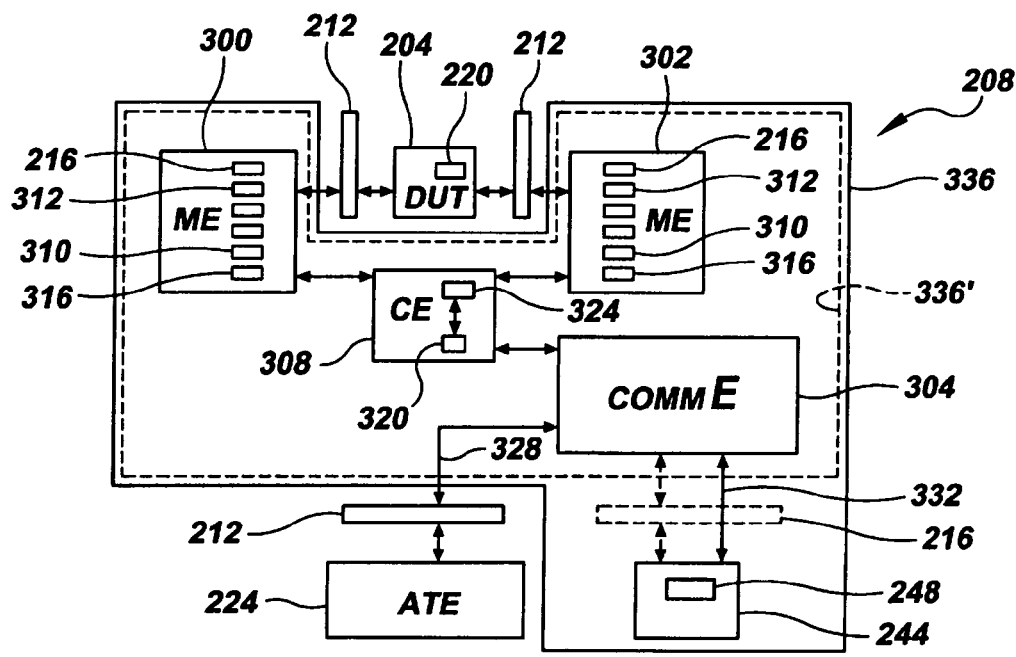
FIG. 3 is a high-level schematic diagram of the testing system of FIG. 2 in conjunction with automated testing equipment and a device under test.

As shown in FIG. 3, testing system 208 may comprise at least one measurement engine 300, 302, a communication engine 304 and a compute engine 308. Each of these components is described in more detail below. However, as a general overview, one or more of measurement engines 300, 302 may include, among other things, testing instruments 312, 316 for electrically exciting, or stimulating, the circuitry being tested and for measuring the effect(s), or response(s), of the excitation on the circuitry. Communications engine 304 provides facilities for communicating with ATE 224 and/or user interface 248 for, among other things, controlling the operation of testing system 208 and downloading test results and other data from the testing system. Compute engine 308 may provide a variety of functions, such as controlling measurement engine(s) 300, 302 and communications engine 304 and processing raw measurement data into useful results.

At a high level, features of testing system 208 may include, among others: 1) its ability to be configured to process measurement data "on-the-fly," i.e., while one or more measurement engines are proceeding with testing; 2) its ability to be configured to interface with a wide variety of ATE 224, including legacy and conventional ATE; and 3) its ability to be configured to interface with dedicated user interface 248 outside the context of ATE. Each measurement engine 300, 302, communications engine 304 and compute engine 308 may be implemented using various hardware and software schemes.

In general, primary tasks of measurement engines 300, 302 include providing stimulus (or stimuli) to DUT 204 and measuring the DUT's response(s) to that stimulus (stimuli). In this connection, each measurement engine 300, 302 may include one or more multi-speed jittered signal generators 216 and one or more jitter response measuring instrument 310 for measuring the response of DUT 204 to the full-speed jittered signal generated by multi-speed jittered signal generator(s) 216. Both of these functions may performed via an interface, e.g., interface board 212, that provides one or more electrical communications pathways (not shown) between DUT 204 and measurement engines 300, 302. Of course, each measurement engine 300, 302, and/or other measurement engines (not shown) may comprise one or more other stimulus instruments 312 for providing a corresponding number of other stimulus signals to DUT 204. Similarly, each measurement engine 300, 302 may additionally include one or more other measurement instruments 316 for measuring the response(s) of DUT 104 to the one or more other stimulus signals.

In addition, depending on the nature of the testing, the number of jitter response measuring instruments 310, or other measurement instruments 316, may or may not be the same as the number of multi-speed jittered signal generators 216, or other stimulus instruments 312. For example, when testing an 8:1 serializer, measurement engine 300 may utilize eight multi-speed jittered signal generators 216, i.e., one for each of the eight parallel inputs, and only one jitter response measuring instrument 310 for measuring the response signal of the serializer on its single serial output. Conversely, when testing a 1:8 deserializer, measurement engine 302 may utilize only one multi-speed jittered signal generators 216 for exciting the serial input of the deserializer and eight jitter response measuring instrument 310 for measuring the deserializer's response on the eight parallel outputs. Of course, measurement engines 300, 302 may have greater than the number of stimulus instruments and/or measurement instruments needed for a particular test. This may be the case when a "general purpose" or highly flexible version of testing system 208 is used for testing circuitry having fewer inputs and/or outputs than the number of stimulus and measurement instruments 216, 310, 312, 316 aboard the testing system. In such cases, testing system 208 can be controlled in a manner that only those of instruments 216, 310, 312, 316 needed for a particular test are utilized.

Compute engine 308 may be configured to function as a central processor and central controller of testing system 208. That is, compute engine 308 may be utilized, among other things, to: 1) setup and control the operation of stimulus instruments 216, 312; 2) process and/or provide input, e.g., stimulus parameters, to stimulus instruments 216, 312; 3) initialize and control the operation of measurement instruments 310, 316; 4) receive output, e.g., digital measurement data, from the measurement engines and process this output into desired results; 5) provide digital input directly to DUT 204; 6) initialize, communicate with and control communications engine 304; 7) perform self-testing; and 8) configure any reprogrammable logic devices (RLDs) utilized in testing system 208, e.g., in the measurement engines or the compute engine itself. Of course, compute engine 308 need not provide all of this functionality if a certain implementation of testing system 208 does not require it. In such cases, only the functionality(ies) desired for that implementation need be provided to testing system 208.

Compute engine 308 may be implemented in any suitable hardware or hardware/software scheme, including, but not limited to, single and multiple chip solutions. Exemplary implementations include full digital signal processor (DSP) implementations, RLD implementations using, e.g., one or more field programmable gate arrays (FPGAs), and implementations comprising both DSP and RLD components, among others. Utilizing RLD technology for compute engine 308 can provide a flexible solution, particularly when it is desirable to customize testing system 208 to each of a variety of testing applications, while enjoying the economies of manufacturing generic hardware. As those skilled in the art will appreciate, any portion(s) of measurement engines 300, 302, e.g., measurement instruments 310, 316, and any portion(s) of compute engine 308, e.g., computation logic (not shown), may be implemented together in a single programmable logic device (PLD) or RLD, e.g., an FPGA. Then, defining measurement engines 300, 302 and compute engine 308 is partly a matter of partitioning a shared device, e.g., an FPGA, by functionality rather than defining the engines by discrete devices. In one embodiment, compute engine 308 may include an RLD 320 and a microcontroller 324 operatively connected to the RLD. One function of microcontroller 324 would be to program (and reprogram, if desired) RLD 320 to suit a particular application. The functioning of microcontroller 324 in this respect in connection with an overall control/programming scheme of testing system 208 is described in more detail below.

For certain applications of testing system 208, e.g., the testing of high-speed digital circuitry, such as SerDes circuitry 220 among many others, the speed of the system is paramount. The integration of compute engine 308 into integrated test system 208 allows testing and processing speeds to be readily optimized and maximized, if needed, due to the close physical proximity of the compute engine to measurement engine(s) 300, 302 and DUT 204. This close physical proximity, or coupling, allows signal propagation delays between compute engine 308 and measurement engine(s) 300, 302 to be minimized. For example, compute engine 308 is preferably, but not necessarily within about 6 inches (15.24 cm), more preferably about 3 inches (7.62 cm) of each measurement engine 300, 302, and even closer spacing may be advantageous. In addition, with the ability, discussed below, of compute engine 308 to process measurement data on-the-fly, data storage requirements and processing delays associated therewith are minimized. Therefore, testing system 208 is not only amenable to high-speed testing, but also minimizes overall test time, which includes the time needed to process raw measurement data into desired results.

As mentioned above, communications engine 304 provides testing system 208 with an ATE communications link 328 for communicating with ATE 224, and/or a user-interface communications link 332 for communicating with user interface 248 supported by host computer 244. ATE communications link 328, if provided, may be established on any one or more of the channels, parallel or serial, that link interface board 212, e.g., a DIB, to ATE 224. Generally, testing system 208 may be configured to appear to ATE 224 as a DUT. Such a configuration can be exploited to allow the testing system 208 to interface with ATE 224 via the ATE's serial channels conventionally used to write and read digital data vectors to a DUT during conventional ATE testing. Many types of legacy and conventional ATE equipment include such serial channels. This interface to ATE 224 can allow for initializing, setting up, controlling, programming (including (re)programming RLD 320, if present) and reading and displaying, or otherwise presenting, output from testing system 208. A benefit to this interface is that manufacturers of conventional and legacy ATE would not have to divulge any proprietary software to a manufacturer of testing system 208 that might want the ATE manufacturers to provide their ATE with custom user interfaces. Of course, in alternative embodiments ATE 224 can be provided with custom interfaces for interfacing the ATE with testing system 208. An example of a programming/control interface compatible with utilizing data vector channels of ATE 224 is discussed in the Roberts et al. application incorporated by reference above.

User-interface communications link 332, if provided, allows testing system 208 to communicate with user interface 248 using any one of a number of communications protocols, such as an Ethernet protocol, among many others. User interface 248 may be implemented on host computer 244 in any suitable manner, such as in a platform-independent programming environment, e.g., the JAVA® programming environment developed by Sun Microsystems, Santa Clara, Calif. In this example, host computer 244 could be a network server, such as a Web server, or the like. In an embodiment in which host computer 244 includes a Web server, user interface 248 could be accessible via a Web browser from a user device 260 (FIG. 2), e.g., computer, workstation, Web appliance or any of a variety of thin clients, e.g., Web-enabled personal digital assistants and cell phones, among others. Like the interface (not shown) provided in connection with ATE communications link 328, user interface 248 could be operatively configured to provide a host of functionalities, including setting up, initializing, controlling, programming (including (re)programming RLD 320, if present) and reading and displaying, or otherwise presenting, output from testing system 208, as needed to suit a particular application. Those skilled in the art will readily understand how to implement user interface 248 using conventional programming techniques once features of testing system 208 have been selected. As mentioned above, host computer 244, and therefore user interface 248, may reside virtually anywhere relative to testing system 208, including onboard a module 336, 336' containing one or more other components of the testing system. The difference between module 336 and module 336' is that module 336 includes host computer 244, whereas module 336' does not. This difference generally leads to differences in connectivity between communications engine 304 and host computer 244. As used herein and in the appended claims, the term "module" is intended to include not only package-type modules, but also structures in which components are substantially fixed relative to one another, including, among others, boards containing components, e.g., packaged chips, engaged therewith, and groupings of packaged chips that, e.g., "plug in" to one another, and even single SOC-type chips.

Figure 4:
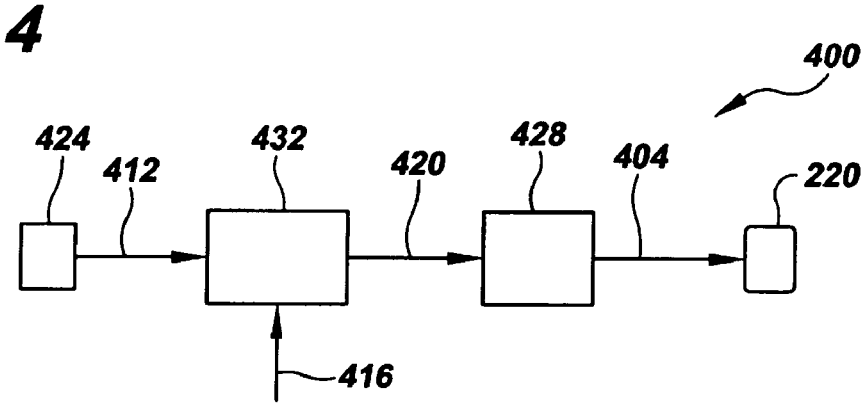
FIG. 4 is a high-level schematic diagram of a multi-speed jittered signal generator of the present invention suitable for use in the testing system of FIGS. 2 and 3.

FIG. 4 shows in accordance with the present invention a multi-speed signal generator 400 suitable for use as jittered test signal generators 216 of FIGS. 2 and 3. As mentioned above, multi-speed jittered signal generator 400 may be used to generate a full-speed test signal 404 for testing any of a variety of circuitry of a DUT, such as SerDes circuitry 220, which is also shown in FIGS. 2 and 3. As a general overview, multi-speed jittered signal generator 400 may generate full-speed jittered test signal 404 from a low-frequency reference signal 412, i.e., a signal having a frequency (speed) lower than the frequency of the full-speed jittered test signal, by first injecting the reference signal with a modulation signal 416 to create a low-speed test signal 420 and then scaling the low-speed test signal up to the desired full test speed so as to create full-speed test signal. In this manner, test signal generating system 400 of the present invention is capable of generating a full-speed test signal, i.e., test signal 404, that has a quality higher than can be achieved by conventional jittered test signal generators. In addition, test signal generating system 400 can typically be implemented at a lower cost than conventional test signal generators operating in the same test frequency regime, since low-speed digital modulation signal 416 can be employed more easily without corrupting full-speed test signal 404.

Figure 11:
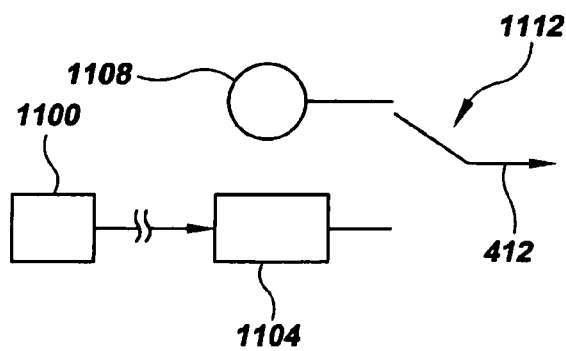
FIG. 11 is a high-level schematic diagram illustrating a switchable-source arrangement for providing the low-frequency reference signal of FIG. 4.

Multi-speed jittered signal generator 400 may include a reference signal generator 424, a frequency scaler 428 (e.g., multiplier), and a jitter injector 432. Reference signal generator 424 generates reference signal 412 at a frequency that is a multiple lower than the desired full-speed frequency of test signal 404. Reference signal generator 424 may be implemented in any hardware and/or software capable of generating the desired low-frequency reference signal 412, including conventional reference signal generators. For example, reference signal generator 424 can be an onboard crystal oscillator of high quality. Alternatively, and referring to FIG. 11, reference signal 412 can be input from an external source 1100, such as ATE 224 of FIG. 2. In this case, a jitter cleaner 1104 can be inserted between external source 1100 and reference signal 412. To accommodate more flexibility, both an internal oscillator, such as oscillator 1108, and external source 1100 may be implemented and made user-selectable using a switch 1112.

Referring again to FIG. 4, frequency scaler 428 is operatively configured to scale-up, e.g., multiply, the frequency of low-frequency test signal 412 by a predetermined amount so as to attain the full-speed frequency of test signal 404. Frequency scaler 428 may be implemented in any hardware and/or software capable of providing the desired scaling. In one embodiment, frequency scaler 428 may be implemented as a PLL, such as PLL 500 of FIG. 5A. PLL 500 may include a phase/frequency detector 504, a charge pump 508, a voltage controlled oscillator 512 and a feedback loop 516 comprising a pre-scalar 520 and an RC circuit 524. A pre-scalar 528 may also be included on the input side of PLL 500. Depending upon its design, PLL 500 can track input phase variations within a certain bandwidth. Depending upon the value of pre-scalars 520, 528 and the time constants of RC circuit 524, a certain band of input may be tracked. FIG. 5B illustrates an exemplary plot 532 of phase response versus frequency of PLL 500 of FIG. 5A. In the embodiment of PLL 500 corresponding to plot 532 of FIG. 5B, the phase response of the PLL is relatively wide-band and relies on a relative small value for pre-scalars 520, 528 in order to maximize the bandwidth of timing errors induced by jitter injector 432 (FIG. 4). As those skilled in the art will readily appreciate, other PLL types can be constructed. The present example is a simple implementation using low-cost CMOS technology.

Figure 5A:
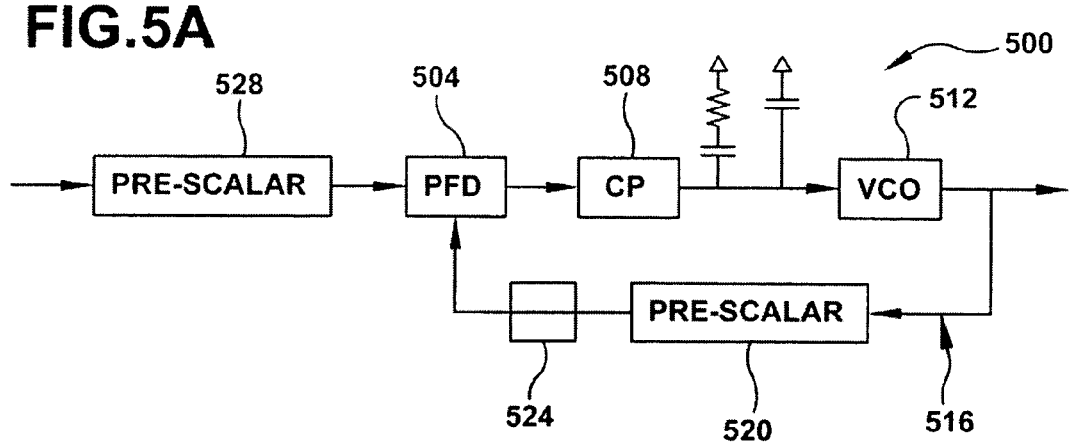
FIG. 5A is a high-level schematic diagram of a phase-locked loop suitable for use in the frequency scaler of FIG. 4.
Figure 5B:
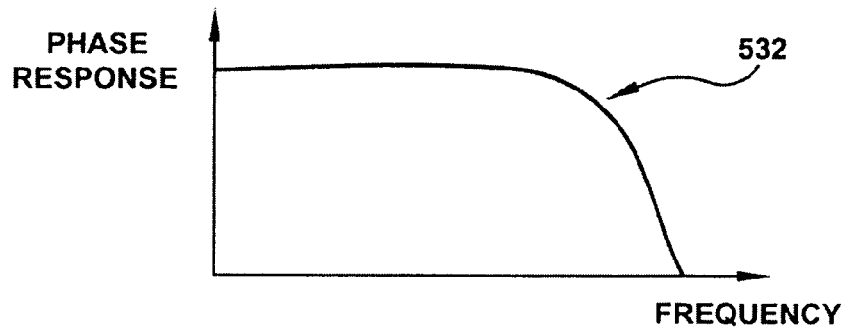
FIG. 5B is an exemplary plot of phase response versus frequency of the phase-locked loop of FIG. 5A.
Figure 6A:
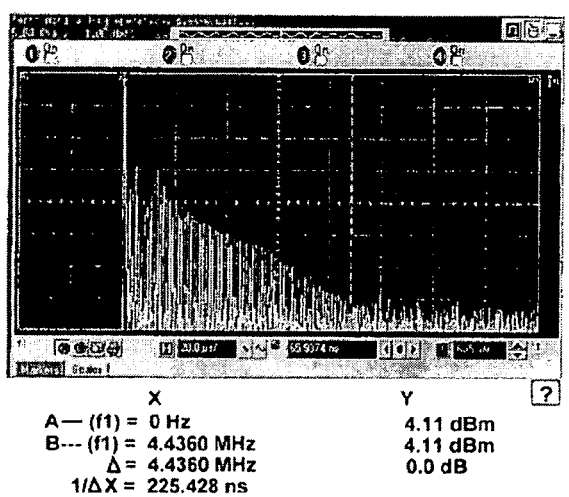
FIG. 6A is a plot of a sample spectrum of a low-speed test signal created by applying a slowly varying modulation signal applied to a low-frequency reference signal.
Figure 6B:
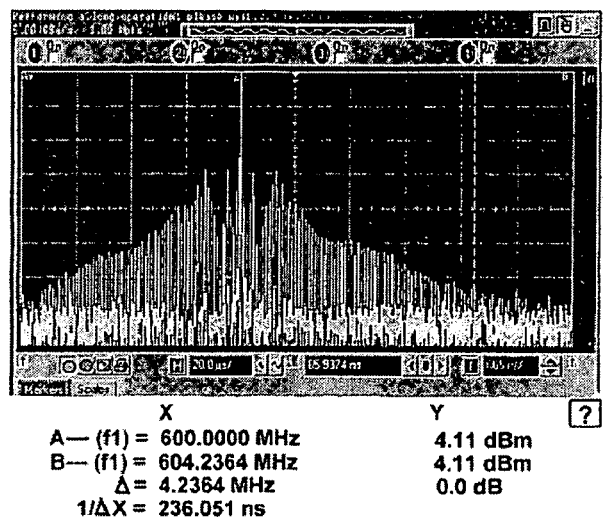
FIG. 6B is a plot of a spectrum of the full-speed test signal corresponding to low-speed test signal of FIG. 6A as output from the PLL of FIG. 5A.
Figure 6C:
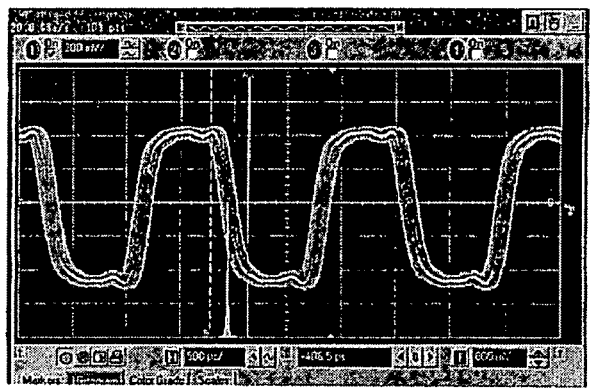
FIG. 6C is a time-domain plot of the full-speed test signal of FIG. 6B.
Figure 6D:
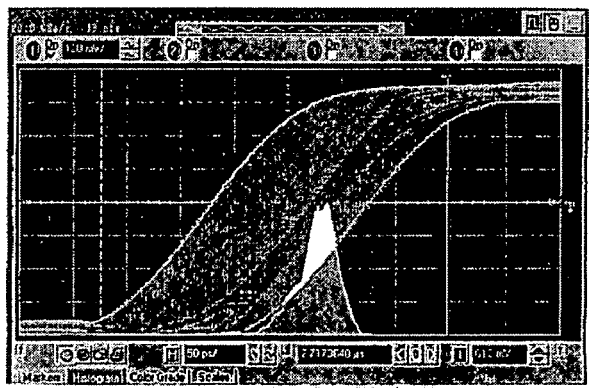
FIG. 6D is a time-domain detail view of the full-speed test signal of FIG. 6B.

In an exemplary multi-speed test signal generator modeled using PLL 500 of FIG. 5A, extremely fine timing errors were generated. FIGS. 6A and 6B show sample spectra illustrating the ability of PLL 500 (FIG. 5A) to track phase variations input into a low-frequency reference signal, e.g., reference signal 412 (FIGS. 4 and 5), via a modulation signal, e.g., modulation signal 416. More particularly, FIG. 6A shows the power spectral density of a low-speed modulation signal, e.g., low-speed modulation signal 416 of FIG. 4, provided as input to perturb reference signal 412. This low-speed test signal comprising a slowly varying modulation signal applied to a low-frequency reference signal. In this example, the low-speed test signal consist of a periodic waveform having a fundamental frequency of about 50 KHz and containing a frequency content up to about 5 MHz. The output of PLL 500 is a frequency scaled version (600 MHz) of the reference signal, e.g., reference signal 412 of FIG. 4, after the timing errors from the modulation signal are induced. Since the frequency scaling of PLL 500 is capable of preserving the phase modulation due to this 50 KHz waveform, the output spectrum is that of a 600 MHz waveform with the same induced modulation. FIGS. 6C and 6D show the output illustrated in FIG. 6B in the time domain. As can be seen, FIGS. 6A-6D illustrate the ability of a multi-speed jittered signal generator, such as generator 400 of FIG. 4, to generate arbitrary deterministic errors, since, in this example, the jitter is more significant in one direction than in the other direction (FIG. 6D).

Figure 7:
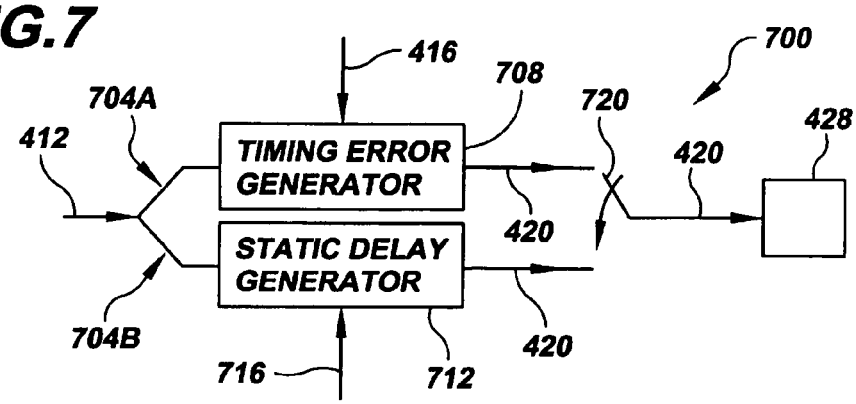
FIG. 7 is a high-level schematic diagram of jitter injection circuitry suitable for use in the jitter injector of FIG. 4.

FIG. 7 illustrates a jitter injector 700 suitable for use as jitter injector 432 of FIG. 4. In one embodiment of multi-speed jittered signal generator 400, it is desired, though not necessary, to generate ideal or close to ideal full-speed test signals in addition to full-speed test signals having artificially induced timing errors induced by modulation signal 416. Consequently, jitter injector 700 may include a timing error path 704A and a static delay path 704B for low-frequency reference signal 412. Timing error path 704A may include a timing error generator 708 that modifies reference signal 412 as a function of modulation signal 416, and static delay path 704B may include a static delay generator 712 that imparts a delay to the reference signal as a function of a delay setting signal 716. In order to select between first path 704A and 704B, and consequently select the type of low-speed test signal 420 being provided to frequency scaler 428, jitter generator 700 may include a selection switch 720. Selection switch 720 may be any switch suitable for the particular implementation of jitter injector 700. For example, for a BIST implementation, switch 720 may include a multiplexer. Those skilled in the art will appreciate the variety of switch types that may be implemented for switch 720.

Figure 8:
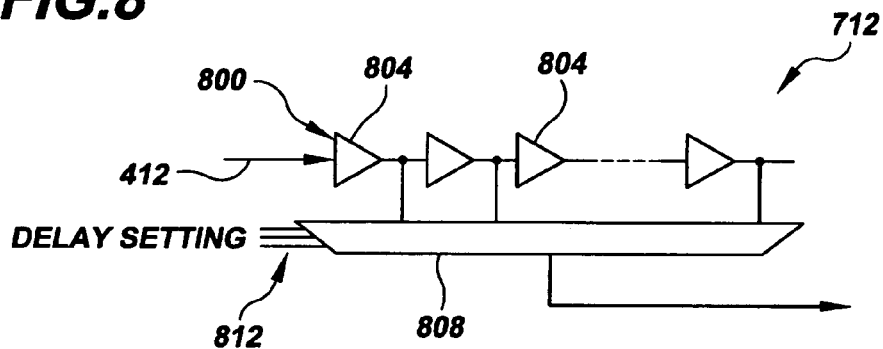
FIG. 8 is a high-level schematic diagram of static delay circuitry suitable for use in the static delay generator of FIG. 7.

Static delay path 704A may be utilized to generate ideal high-frequency waveforms. As illustrated in FIG. 8, static delay generator 712 of FIG. 7 may comprise a chain, i.e., a delay line 800, of delay elements 804 that impart a delay into low-frequency reference signal 412. Delay elements 804 may be controlled by a delay setting decoder 808. Different delay settings may be obtained, e.g., by inputting a digital word to decoder 808 via delay inputs 812. These delay settings may be static, so that the digital input selection need not be exercised except during a setup phase. In cases wherein the performance of static delay path 704B (FIG. 7) is critical, static delay generator 712 may consist of a straight-through connection from static delay path 704B to switch 720 (FIGS. 7 and 4). Although one particular embodiment of static delay generator 712 has been described, those skilled in the art will readily appreciate that other embodiments may be utilized and will understand how to implement such other embodiments.

Figure 9:
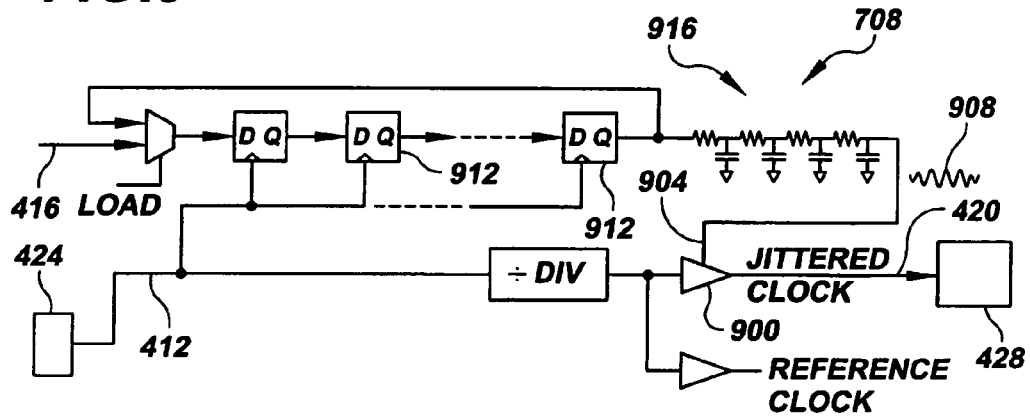
FIG. 9 is a schematic diagram of a timing error circuitry suitable for use in the timing error generator of FIG. 7.

Referring again to FIG. 7, and also to FIG. 9, when full-speed test signal 404 is desired to contain timing errors, a user would use switch 720 to select timing error path 704A so as to utilize timing error generator 708 to generate low-speed test signal 420. As illustrated in FIG. 9, timing error generator 708 may include a tunable delay generator 900 located between reference signal generator 424 and frequency scaler 428. By modulating an input 904 to tunable delay generator 900 using an analog waveform 908, the delay characteristics of the tunable delay generator can be altered. Analog waveform 908 may be generated from a digital form of modulation signal 416, e.g., using a series of circularly connected flip-flops 912 and a passive RC filter 916. Advantages of this approach includes the fact that it provides a digital interface for applying modulation signal 416 and extremely fine jitter generation may be achieved. Ideally, infinitesimally small jitter can be induced into reference signal to create low-speed test signal 420. U.S.

patent application Ser. No. 09/844,675, which is incorporated herein by reference, discloses a method for initializing the states on flip-flops 912 for generating the analog modulation signal. Passive RC filter 916 can be designed using conventional methods.

Figure 10A:
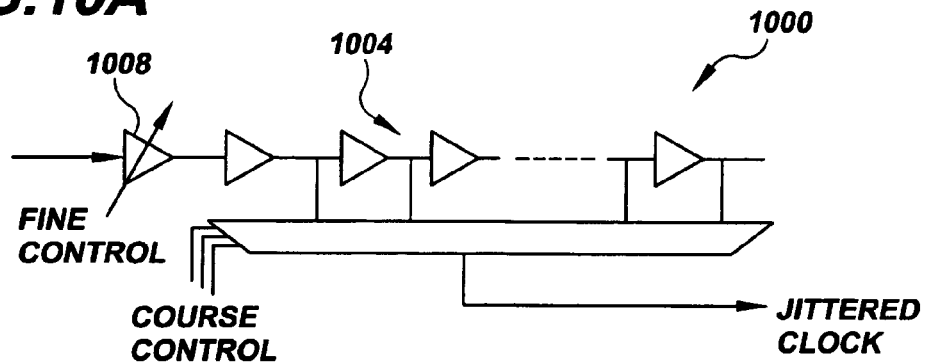
FIG. 10A is a high-level schematic diagram of alternative timing error circuitry suitable for use in the timing error generator of FIG. 7.

FIG. 10A illustrates an alternative timing error generator 1000 that may be used for timing error generator 708 of FIG. 7. Timing error generator 1000 may contain a delay line 1004 similar to delay line 804 of static delay generator 712 of FIGS. 7 and 8, but having a phase interpolating fine delay tuner 1008 between low-frequency reference signal generator 424 and the delay line. The reason for including fine delay tuner 1008 is to overcome the coarseness of the delay characteristics of a delay-line based approach. It is noted that delay line 804 of FIG. 8 could be used to introduce arbitrary deterministic or pseudo-random jitter just like timing error generator 708 of FIGS. 7 and 9. However, a disadvantage of using a delay-line such as delay line 804 of FIG. 8 is that only large amounts of jitter (timing error) can be introduced into the low-speed reference signal. Such large amounts of jitter could readily exceed the stress levels required for modern high-speed devices. Timing error generator 708 of FIGS. 7 and 9 are free of this limitation.

Figure 10B:
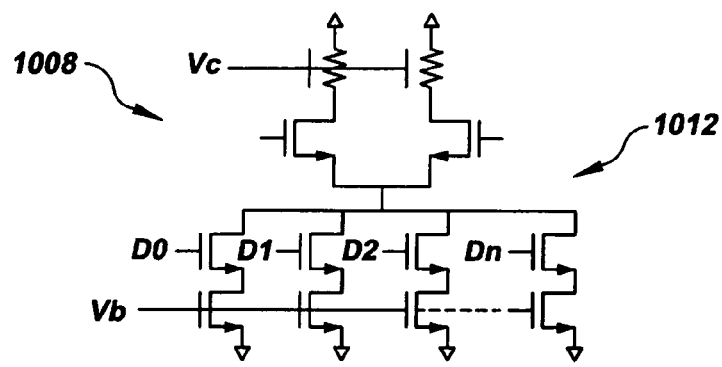
FIG. 10B is schematic diagram of fine control circuitry suitable for use in the fine delay tuner of FIG. 10A.

Fine tuner 1008 of alternative timing error generator 1000 avoids this limitation for delay line 1004 as well. Fine delay tuner 1008 is capable of generating programmable delays that are fractions of a unit delay interval for a given technology. One possible implementation of fine delay tuner 1008 is shown in FIG. 10B. In this implementation, fine delay tuner comprises a simple tunable delay buffer 1012 controlled by a digitally programmable current source. By applying different digital words to the tail current source of delay buffer 1012, different delay characteristics can be implemented. Advantages of this approach include completely digital control and good linearity. It is noted that although two exemplary embodiments of timing error generator 708 have been particularly described, other embodiments may certainly be used within the spirit and scope of the present invention. Since those skilled in the art will understand how to make and implement alternative timing error generators, it is not necessary to provide an exhaustive list nor description of them.

Figure 12:
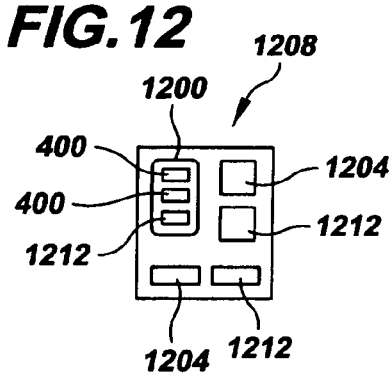
FIG. 12 is a very high-level schematic diagram of an integrated circuit chip containing a plurality of the type of multi-speed jittered signal generator shown in FIG. 4.

Referring now to FIG. 12, as mentioned above a multi-speed jittered signal generator of the present invention, such as generator 400 of FIG. 4, may be implemented in a BIST, such as BIST 1200 provided for testing one or more integrated circuits 1204 onboard an integrated circuit chip 1208. Chip 1208 may be any type of chip that includes functional integrated circuit(s) 1204 amenable to testing using one or more jittered signal generators 400 and that may also include one or more other functional integrated circuits 1212 not amenable to testing using the signal generator(s) and/or other testing circuitry 1216 for performing tests on functional circuit(s) 1204 and/or functional circuit(s) 1212, e.g., for performing measurements in connection with the jittered signal generator(s) and, optionally, other testing instruments. Examples of functional circuit(s) 1204 include high-speed digital circuitry, such as SerDes devices, PLL circuits, clock distribution buffers and retimers, among others. Functional circuit(s) 1212 may be any circuitry needed to provide chip 1208, in combination with functional circuit(s) 1204, with its desired functionality. Examples of other testing circuitry 1216 are mentioned above and discussed in more detail in U.S. patent application Ser. No. 10/838,846 incorporated by reference.

Although the invention has been described and illustrated with respect to an exemplary embodiment thereof, it should be understood by those skilled in the art that the foregoing and various other changes, omissions and additions may be made therein and thereto, without parting from the spirit and scope of the present invention.

What is claimed is:

1. A system for generating a jittered signal, comprising:
   a jitter generator for providing a jittered test signal to a circuit under test, said jitter generator comprising:
   a) a jitter injector operatively configured to inject jitter into a reference signal having a first frequency so as to generate a first jittered signal, wherein said jitter injector comprises a timing error generator, a static delay generator and a switch operatively configured for switching between said timing error generator and said static delay generator;
   b) a frequency sealer operatively configured to multiply said first jittered signal by a frequency multiplier so as to generate said jittered test signal having a second frequency higher than said first frequency; and
   c) an output for providing said jittered test signal to a circuit under test when the circuit under test is in communication with said jitter generator and the circuit under test is being tested using said jitter generator.

2. A system according to claim 1, wherein said frequency scaler includes phase locked loop circuitry operatively configured to generate said jittered test signal.

3. A system according to claim 1, further comprising a signal generator operatively configured to generate said reference signal.

4. A system according to claim 1, further comprising a modulator operatively configured to generate a modulating signal containing jitter information, said jitter injector operatively configured to generate said first jitter signal as a function of said reference signal and said modulating signal.

5. A system according to claim 4, wherein said modulator is digitally programmable.

6. A system according to claim 1, wherein said first jittered signal has a plurality of phase variations and said frequency scaler is operatively configured to substantially track said plurality of phase variations.

7. A system for generating a jittered signal, comprising:
   a jitter generator for providing a jittered test signal to a circuit under test, said jitter generator comprising:
   a) a jitter injector operatively configured to inject jitter into a reference signal having a first frequency so as to generate a first jittered signal, wherein said jitter injector comprises a static delay generator that includes a delay line having a delay setting decoder operatively configured for controlling said delay line;
   b) a frequency scaler operatively configured to multiply said first jittered signal by a frequency multiplier so as to generate said jittered test signal having a second frequency higher than said first frequency; and
   c) an output for providing said jittered test signal to a circuit under test when the circuit under test is in communication with said jitter generator and the circuit under test is being tested using said jitter generator.

8. A system for generating a jittered signal, comprising:
   a jitter generator for providing a jittered test signal to a circuit under test, said jitter generator comprising;
   a) a jitter injector operatively configured to inject jitter into a reference signal having a first frequency so as to generate a first jittered signal, wherein said jitter injector comprises a timing error generator that includes a tunable delay generator responsive to an analog waveform;
b) a frequency sealer operatively configured to multiply said first jittered signal by a frequency multiplier so as to generate said jittered test signal having a second frequency higher than said first frequency; and
c) an output for providing said jittered test signal to a circuit under test when the circuit under test is in communication with said jitter generator and the circuit under test is being tested using said jitter generator.

9. A system according to claim 8, further comprising a series of circularly connected flip flops and a passive RC filter for generating said analog waveform.

10. A system for generating a jittered signal, comprising: a jitter generator for providing a jittered test signal to a circuit under test, said jitter generator comprising:
a) a jitter injector operatively configured to inject jitter into a reference signal having a first frequency so as to generate a first jittered signal, wherein said jitter injector comprises a timing error generator that includes a delay line and a fine delay tuner in operative communication with said delay line;
b) a frequency scaler operatively configured to multiply said first jittered signal by a frequency multiplier so as to generate said jittered test signal having a second frequency higher than said first frequency; and
c) an output for providing said jittered test signal to a circuit under test when the circuit under test is in communication with said jitter generator and the circuit under test is being tested using said jitter generator.

11. A system according to claim 10, wherein said timing error generator further includes a delay setting decoder operatively configured for controlling said delay line.

12. A system according to claim 10, wherein said fine delay tuner comprises a digitally tunable delay buffer.

13. An integrated circuit chip, comprising:
a) built-in-self-test circuitry that includes:
i) a jitter injector operatively configured to inject jitter into a reference signal having a first frequency so as to generate a first jittered signal, wherein said jitter injector comprises a timing error generator, a static delay generator and a switch operatively configured for switching between said timing error generator and said static delay generator; and
ii) a frequency scaler operatively configured to multiply said first jittered signal by a frequency multiplier so as to generate a second jittered signal having a second frequency higher than said first frequency; and b) functional circuitry in communication with said built-in-self-test circuitry so that said functional circuitry is testable with said second jittered signal.

14. A method of generating a jittered test signal having a first frequency, comprising the steps of:
a) injecting jitter into a reference signal so as to generate a first jittered signal having a first frequency; and
b) multiplying said first jittered signal by a predetermined frequency multiplier so as to generate a jittered test signal having a second frequency greater than said first frequency;
wherein said first littered signal has a first phase variations and the method further comprises tracking said first plurality of phase variations so that said jittered test signal includes a second plurality of phase variations that track said first plurality of phase variations, wherein the first jittered signal is generated by a jitter injector comprising a timing error generator, a static delay generator and a switch operatively configured for switching between said timing error generator and said static delay generator.

15. A method according to claim 14, wherein step a) includes generating said first jittered signal as a function of said reference signal and a modulating signal.

16. A method of testing circuitry, comprising the steps of:
a) injecting jitter into a reference signal so as to generate a first jittered signal having a first frequency;
b) multiplying said first jittered signal by a predetermined frequency multiplier so as to generate a second jittered signal having a second frequency greater than said first frequency; and
c) stimulating said circuitry as a function of said second jittered signal;
wherein said first jittered signal has a first plurality of phase variations and the method further comprises tracking said first plurality of phase variations so that said second jittered signal includes a second plurality of phase variations that track said first plurality of phase variations, wherein the first jittered signal is generated by a jitter injector comprising a timing error generator, a static delay generator and a switch operatively configured for switching between said timing error generator and said static delay generator.

17. A method according to claim 16, wherein step a) includes generating said first jittered signal as a function of said reference signal and a modulating signal.

* * * * *